US008854902B2

(12) United States Patent
Kohli

(10) Patent No.: US 8,854,902 B2
(45) Date of Patent: Oct. 7, 2014

(54) WRITE SELF TIMING CIRCUITRY FOR SELF-TIMED MEMORY

(75) Inventor: Nishu Kohli, Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 224 days.

(21) Appl. No.: 13/474,825

(22) Filed: May 18, 2012

(65) Prior Publication Data

US 2013/0308399 A1  Nov. 21, 2013

(51) Int. Cl.
*G11C 7/00* (2006.01)
*G11C 11/56* (2006.01)
*G11C 16/04* (2006.01)
*G11C 11/413* (2006.01)

(52) U.S. Cl.
CPC ........ *G11C 11/5621* (2013.01); *G11C 11/5628* (2013.01); *G11C 16/04* (2013.01); *G11C 16/0475* (2013.01); *G11C 11/413* (2013.01); *G11C 11/5642* (2013.01)
USPC ............ 365/189.16; 365/189.11; 365/210.11; 365/210.14

(58) Field of Classification Search
CPC ........... G11C 11/5621; G11C 11/5628; G11C 11/5635; G11C 11/5642; G11C 11/413; G11C 16/04; G11C 16/0475
USPC ........ 365/189.16, 189.11, 241, 210.1, 210.14
See application file for complete search history.

(56) References Cited

U.S. PATENT DOCUMENTS

| 5,581,500 | A  | * | 12/1996 | D'Souza ...................... 365/156 |
| 6,519,204 | B2 | * | 2/2003  | Slamowitz et al. ...... 365/230.05 |
| 6,556,487 | B1 | * | 4/2003  | Ratnakumar et al. .... 365/185.08 |
| 8,345,469 | B2 | * | 1/2013  | Pelley et al. .................. 365/154 |
| 2002/0149974 | A1 |   | 10/2002 | Sato et al. |
| 2007/0279966 | A1 | * | 12/2007 | Houston ....................... 365/154 |
| 2008/0137440 | A1 |   | 6/2008  | Liaw |
| 2012/0307574 | A1 |   | 12/2012 | Cheng et al. |
| 2013/0308397 | A1 | * | 11/2013 | Kohli ...................... 365/189.15 |

* cited by examiner

*Primary Examiner* — Pho M Luu
(74) *Attorney, Agent, or Firm* — Gardere Wynne Sewell LLP

(57) ABSTRACT

A self-timed memory includes a plurality of write timer cells. A reference write driver circuit writes a logic low value to a true side of the write timer cells. Each write timer cell includes a pullup transistor whose gate is coupled to an internal true node. Self-timing is effectuated by detecting a completion of the logic value write at a complement side of the write timer cells and signaling a reset of the self-timer memory in response to detected completion. To better align detected completion of the write in write timer cells to actual completion of a write in the memory, a gate to source voltage of the write timer cell pullup transistor is lowered by increasing a lower logic level voltage at the internal true node in connection with driver circuit operation to write a low logic state into the true side of the write timer cell.

30 Claims, 5 Drawing Sheets

US 8,854,902 B2

WRITE SELF TIMING CIRCUITRY FOR SELF-TIMED MEMORY

TECHNICAL FIELD

The present invention relates to integrated self-timed memory circuits and in particular to a self-timed static random access memory (SRAM) integrated circuit.

BACKGROUND

Reference is made to FIG. 1 which shows a schematic diagram of a standard six transistor (6T) static random access memory (SRAM) cell 10. The cell 10 includes two cross-coupled CMOS inverters 12 and 14, each inverter including a series connected p-channel and n-channel transistor pair. The inputs and outputs of the inverters 12 and 14 are coupled to form a latch circuit having a true node 16 and a complement node 18. The cell 10 further includes two transfer (passgate) transistors 20 and 22 whose gate terminals are coupled with a wordline node and are controlled by the signal present at the wordline node (WL). Transistor 20 is source-drain connected between the true node 16 and a node associated with a true bitline (BLT). Transistor 22 is source-drain connected between the complement node 18 and a node associated with a complement bitline (BLC). The source terminals of the p-channel transistors in each inverter 12 and 14 are coupled to receive a high supply voltage (for example, VDD) at a high voltage node $V_H$, while the source terminals of the n-channel transistors in each inverter 12 and 14 are coupled to receive a low supply voltage (for example, GND) at a low voltage node $V_L$. The high voltage VDD at the node $V_H$ and the low voltage GND at the node $V_L$ comprise the power supply set of voltages for the cell 10.

In an integrated circuit including the SRAM cell 10, this power supply set of voltages may be received at pins of the integrated circuit, or may instead be generated on chip by a voltage regulator circuit which receives some other set of voltages from the pins of the chip. The power supply set of voltages at the nodes $V_H$ and $V_L$ are conventionally applied to the SRAM cell 10 at all times that the cell/integrated circuit is operational. It will be recognized that separate low voltage values at node $V_L$ may be provided for the sources of the n-channel MOS transistors in the inverters 12 and 14 while separate high voltage values at node $V_H$ may be provided for the sources of the p-channel MOS transistors in the inverters 12 and 14.

The reference above to a six transistor SRAM cell 10 of FIG. 1 for use as the data storage element is made by way of example only, it being understood to those skilled in the art that the cell 10 could alternatively comprise a different data storage element. The use of the term SRAM cell 10 will accordingly be understood to refer any suitable memory cell or date storage element, with the circuitry, functionality and operations presented herein in the exemplary context of a six transistor SRAM cell.

Reference is now made to FIG. 2 which shows a block diagram of a self-timed memory 30, for example of the static random access memory (SRAM) type using memory cells 10, with "w" words and "b" bits organized as a column mux of "m". Those skilled in the art understand that self-timed memories need to support a high dynamic operating voltage range. In other words, these memories need to be functional over a wide range of supply voltages, starting from a very high operating voltage and down to a very low operating voltage. In most cases, in the low operating voltage range, it is considered acceptable if the memory achieves a lower performance (i.e., it is slower). In nominal operating voltage range, the memory needs to support a higher performance (i.e., it needs to be faster).

The memory 30 includes a first section 32 comprising a plurality of memory (such as SRAM) cells 10 arranged in a matrix format and which function to store data. The first section 32 includes "b" sub-sections 34 corresponding to the "b" bits per word stored by the memory. The first section 32 is arranged to store "w" words and is organized as a column mux of "m". Thus, each of the "b" sub-sections 34 is organized in "w/m" rows with "m" columns in each row. In the first section 32, all cells 10 in a same row share a common wordline (WL) coupled to an output of a row decoder circuit 60 (well known to those skilled in the art), and all cells 10 in a same column share a common true bitline (BLT) and a common complement bitline (BLC) coupled to column circuitry 62 (which includes bitline precharge and equalization circuitry, column mux circuitry, write driver circuitry, column address decoder circuitry and input/output circuitry, each of which is well known to those skilled in the art).

To write data to the first section 32, the wordline of the row selected according to the row address is driven high by the row decoder circuitry 60, a column is selected in each sub-section 34 by the column address decoder and column mux in the column circuitry 62 based on the column address to connect the selected column's true bitline and complement bitline to the input/output circuitry (which, for example, will typically utilize bitline write drivers), and both the true bitline and complement bitline of the selected column in each sub-section 34 are made floating by the precharge and equalization logic in the column circuitry 62. One of the true bitline and complement bitline discharges in each sub-section 34 depending on the output of the bitline write driver circuitry, and the bitline voltages are transferred to the corresponding internal true node 16 and complement node 18 of the memory cell 10 in the selected row and column in the sub-section 34 so as to write and store the proper data state.

The memory 30 includes a second section 46 including plurality of memory cells 10 arranged in a matrix format, but these cells do not function to store data. Indeed, these cells are only required, if desired, in order to have a regular layout of the memory array. The wordline ports of the memory cells 10 both the rows in this section are connected to the ground reference voltage (GND).

The memory 30 includes a third section 36 including plurality of memory cells 10 arranged in a matrix format, and these cells also do not function to store data. Rather, these cells in the third section 36 are used to emulate the same load on a reference wordline (REFWL), which is coupled to a reference row decoder 64 within the section 36, as is present on the actual wordlines (WL) of the first section 32. In other words, the purpose of section 36 is to emulate a total load of "b*m" columns of memory cells 10 on the reference wordline REFWL. It will be noted that the REFWL signal generated by the reference row decoder circuit 64 passes through the second section 46 to the third section 36 without being connected to cells 10 included in section 46.

The section 36 includes "b" sub-sections 38. Each sub-section 38 includes two rows of "m" memory cells 10. All memory cells 10 within the third section 36 either have their true bitlines and complement bitlines connected to a power supply voltage (for example, at node $V_H$) or have them floating. The wordline ports of the memory cells 10 within one of the two rows of the first half of the total "b" sub-sections 38 (i.e., of the first "b/2" sub-sections 38) are coupled to the reference wordline signal generated by the reference row decoder circuit 64 and arriving in section 36 after having passed through the second section 46. This is done to emulate the same propagation delay corresponding to "b*m/2" columns on REFWL as is present on all the WL signals in propagating from row decoder 60 to the middle of section 32. Further, the REFWL signal which has thus reached at or about the center of the section 36 is twisted back and returned towards reference row decoder circuit 64. This returning REFWL signal is connected to the other of the two rows of the first half of the total "b" sub-sections 38 (i.e., of the first "b/2" sub-sections 38), eventually reaching the second section 46 again after experiencing a propagation delay corresponding to travelling across "b*m" columns—same as that experienced by the signal WL in propagating from row decoder 60 to the column farthest from the row decoder 60 at the end of section 32. The reference wordline of the memory cells 10 in both rows within other "b/2" sub-sections 38 (i.e., later "b/2" sub-sections 38) is coupled to a ground supply voltage (at the node $V_L$) because these sub-sections 38 are present in the memory only for maintaining regularity and rectangular shape of the array of the memory cells 10, and so the memory cells 10 in these sub-sections 38 are deactivated permanently by connecting their wordline ports to a ground supply voltage (for example, at the node $V_L$).

The memory 30 further includes a fourth section 40 including a plurality of write timer cells 42 and load cells 44 arranged in a matrix format: "w/m" rows and one column. The write timer cells 42 and load cells 44 each have a configuration similar to a memory cell 10 (like the SRAM cell shown in FIG. 1).

The timer cells 42 are essentially memory (for example, SRAM) cell like elements that are built from the same devices as used by the memory cells 10 in section 32. These timer cells 42 operate to write a logic low "0" data state from the reference true bitline (REFBLT) and reference complement bit line (REFBLC), in response to arrival of a reference wordline (REFWL) signal, into the internal true node "REFIT" (with the data write time being indicative of time required to write data from an actual bitline in the memory cell 10 of section 32). The load cells 44 are elements similar to write timer cells 42, with the difference that their reference wordline (REFWL) ports are grounded, so that they serve to match the load of actual bitlines (BLT/BLC) on REFBLT and REFBLC. The wordlines WL generated in the row decoder circuitry 60 simply pass through this section 40 in order to reach the first section 32.

There are a total of "w/m" write timer cells 42 and load cells 44, in order to emulate same load on the reference true and complement bitlines within section 40 as is present on the true and complement bitlines within first section 32. A certain number of these "w/m" cells are timer cells 42, and the remaining are load cells 44. The internal nodes REFIT and REFIC of the timer cells 42 are connected together in order to improve their load driving capability as well as reduce the statistical variability of write time of the internal nodes REFIT and REFIC, in turn reducing the statistical variability of the write cycle time. Thus, the write timer cells 42 are designed to store data in the latch circuitry (i.e., write a logic "0" on the true node REFIT followed by a rising to logic "1" on the complement node REFIC) with a write time which is substantially the same as that required for the latch circuitry of a selected actual memory cell 10 to have data written in the true and complement nodes during a write operation. The write time (i.e., rate of data storage) of the timer cells 42 is desired to be about the same as the write time of the actual internal latch nodes of the memory cells 10 so that the complement node (REFIC) is able to rise to a logic high level detectable by a detector circuit (such as an inverter circuit) contained within the column circuitry 62 in the same time in which a memory cell 10 with a statistically worst write time is able to have actual data written into it and its latch circuit set accordingly. Multiple write timer cells 42 with their internal nodes REFIT and REFIC shorted together help in improving the load driving capability of the internal nodes and reducing statistical variability of the rise time of REFIC and in turn the cycle time of the write operation (as explained above). This detection of REFIC state change is propagated by subsequent logic to generate an end of write cycle reset "WRITERST" signal which triggers the beginning of various internal reset events of the memory such as wordline off, bitline precharge on and write driver off to prepare the memory to receive the next command. Thus, the intention of this operation is to time the start of write cycle reset events inside the memory at an optimum time permitting a certain memory cell 10 with a statistically worst write time in section 32 to be successfully written with data corresponding to its data bit (I/O) in any write cycle.

A more detailed description of memory operation is now provided. Before any write cycle begins, all memory bitlines and the reference bitlines are precharged to logic high (VDD), all memory wordlines (WL) and the reference wordline (REFWL) are driven to logic low (GND) and the timer cells 42 are initialized in the state with REFIT storing logic "1" and REFIC storing logic "0". At the start of a valid write operation characterized by the "clock" edge when the "chip select" signal is asserted for enabling the memory and the "write enable" signal is asserted for the write operation, a clock generator triggers the internal clock signal at the arrival of the "clock" edge (either rising or falling edge depending on the functionality of the memory). The internal clock signal triggers the following operations (more or less concurrently): a) drive a selected one of the "w/m" wordlines WL (depending on row address) to logic high; b) drive the reference wordline (REFWL) to logic high; c) turn off precharge of the reference bit lines (REFBLT, REFBLC), and turn off precharge of the bit lines (BLT, BLC) of a selected one of the "m" columns in each of "b" bits (depending on column address); d) trigger the write driver circuitry in the column circuitry 62 in each of the "b" bits to drive one of the "m" bit line pairs of the first section 32 in each bit (I/O) (depending on column address) with either logic "1-0" or logic "0-1" based on data to be written onto corresponding bit (as indicated by the input/output circuitry); and e) trigger the reference write driver circuitry of the column circuitry 62 to drive a logic "0" onto the reference bit line true REFBLT node which will eventually lead to a flip of the original data maintained at the internal true and complement nodes (REFIT, REFIC) in the write timer cells 42 (i.e., the logic "1" on REFIT would be flipped to logic "0" and the logic "0" on REFIC would be flipped to logic "1").

The above operations in turn start the following operations (performed more or less concurrently): a) the rising of the selected wordline and the driving of logic "0-1" or logic "1-0" on to the bit line (BLT, BLC) pairs of the selected column of any bit (I/O) begins the write operation on the memory cell in selected row and selected column for each bit (in the first section 32); and b) the rising of reference wordline (REFWL) and driving of a logic "0" onto the true reference bit line "REFBLT" begins a reference write operation on the multiple write timer cells 42 of the third section 40, causing the internal true node "REFIT" to fall to logic "0" and the internal complement node "REFIC" to start rising towards logic "1".

It will be noted that there is only a single memory cell 10 in each bit (I/O) which is being written by the true and complement bit lines (BLT, BLC), but there are multiple write timer cells 42 in parallel in a column that are being written with an opposite data by the reference true and complement bit lines (REFBLT, REFBLC). Thus, the time period required for the parallel connected latches of the timer cells 42 to change state is expected to be the same as the time required for the latch of a nominal memory cell 10 in any bit (I/O) to change state, because the multiple number of timer cells 42 acting on the internal nodes REFIT and REFIC would reduce the statistical variability of the time taken by the timer cells 42 to change state resulting in a time almost equal to that taken by a nominal memory cell 10. Thus, it will be accurate to say that the time it takes for data to be completely written onto any memory cell 10 of the section 32 is statistically much more variable than what it takes to write data onto the write timer cells 42 connected in parallel in the section 40.

In the memory of FIG. 2, as per the prior art, both the wordline WL and reference wordline REFWL are driven by similarly sized drivers, to a full logic high, while the bit lines (either BLT or BLC depending on data to be written in any bit (I/O)) as well as the true reference bit line REFBLT are driven to full logic low, by similarly sized bitline write drivers of similar fanout. The change in logic state at the internal node REFIC of the write timer cells 42 generates an end of write cycle reset WRITERST signal. The generated WRITERST signal activates the control circuitry of the memory to trigger the beginning of various internal reset events of the memory such as wordline off, bitline precharge on and write driver off to prepare the memory to receive the next command. By this time, the write data of any bit (I/O) is latched by the selected memory cells 10 for the respective bits (I/Os), thus completing the write operation.

It is desirable to have the write timer cells 42 designed and their number chosen such that, in about the same time that a memory cell 10 with a statistically worst write time takes to latch data corresponding to the true and complement bitlines (BLT, BLC), on any process (P), voltage (V) and temperature (T) condition, the multiple timer cells 42 are able to latch data with the reference internal node REFIC rising to a level detectable by a simple detector circuit (such as an inverter) in the column circuitry 62. That way, the rising of the REFIC node can be detected by the column circuitry 62 to generate the end of write cycle reset WRITERST signal at an optimum time for performing the write operation successfully and with best (i.e., least) write cycle time. The WRITERST signal turns off the wordline WL, reference wordline REFWL, write drivers and reference write driver (in the column circuitry 62), precharges the bit lines BLT/BLC and reference bit lines REFBLT/REFBLC, and resets the write timer cells 42 and internal clock generator. A new write operation may then be initiated.

Reference is now made to FIG. 3 which presents a timing diagram illustrating the write operation. From FIG. 3, it can be observed that in order to design a robust memory (i.e., a memory that yields well under corner case conditions also), it is important to tune the delay period "TREFWRITE" (measuring the delay from initiation of the reference write operation to completion of state change for the reference internal node REFIC) in such a way that a write to a memory cell with a statistically worst write time equal to "TWRITE" (measuring the delay from initiation of the array write operation to completion of state change for the internal nodes 16 and 18) is able to be completed before the signal WRITERST is generated (and the wordline and bit lines are reset). The delay "TREFWRITE_WRRST" measures the delay between completion of state change for the reference internal node REFIC and the active state of the WRITERST signal. Thus, if "TWRITE" is the write time of a memory cell with a statistically worst write time (indicated by completion of change in the internal true and complement nodes 16 and 18), and if "TREFWRITE" is the write time of the "n" write timer cells 42 connected in parallel and included within the section 40, it would be ideal to have "TWRITE" and "TREFWRITE" have substantially the same value across different process (P), voltage (V) and temperature (T) conditions. The value of "TREFWRITE" should preferably be such that for any P, V and T condition, the time it takes for the write timer cell 42 to flip causing the internal complement node REFIC to rise beyond a level which is detected by a detector circuit (such as a simple inverter) to generate WRITERST signal and further terminate the write operation, is always longer than, but as close as possible to, the time TWRITE required for the completion of a write to a worst memory cell 10 with a statistically worst write time.

But, the issue is that the statistically worst write time (TWRITE, which is to be qualified in the design) for a worst case memory cell is primarily a function of the pull up device in the memory cell 10 whose threshold voltage "vtpu" is much higher than the threshold voltage of the pullup device of a nominal memory cell 10. However, the time it takes for the write timer cells 42 to change state is a function of the presence of multiple write timer cells in the section 40, which results in a reduction of their statistical variability (i.e., the standard deviation of the equivalent threshold voltage of "n" MOSFET devices connected in parallel equals "$1/\sqrt{n}*sigma$" of the threshold voltage of a single device, where "sigma" is the standard deviation of a single memory cell 10). Thus, with "n" MOSFET devices connected in parallel, the overall threshold voltage within the section 40 for the timer cells 42 is nearly the same as that of a pullup device having the nominal threshold voltage, and hence not representative of the memory cell 10 including a pullup device with statistically worst threshold voltage and hence the worst write time. Because of this difference in threshold voltages between the pullup device of memory cell 10 with statistically worst write time and the equivalent threshold voltage of parallel connected pullup devices of multiple timer cells 42, the voltage scaling characteristics of their write times are very different.

To address this issue, the prior art teaches the selective coupling of capacitive loads on the internal reference complement node REFIC as a function of operating voltage. For example, different capacitive loads, having capacitance values of C1 and C2 (where C1>C2) are connected to the internal reference complement node REFIC through two passgates whose control terminals receive a control signal (say LV). The passgates respond to the control signal, whose logic value is a function of operating voltage, by connecting the C1 load to REFIC when a lower operating voltage is used, and conversely connecting the C2 load to REFIC when a higher operating voltage is used.

The prior art further teaches a solution which instead selectively couples different logic delays with respect to the propagation of the WRITERST signal as a function of operating voltage. For example, different timing delays, having values of D1 and D2 (where D1>D2) are connected between the generation of the WRITERST signal and its control over downstream reset operations. The delays are selectable in response to a control signal (LV), whose logic value is a function of operating voltage, by connecting the D1 delay when a lower operating voltage is used, and conversely connecting the D2 delay when a higher operating voltage is used.

Limitations of these prior art solutions include: a more complicated system design resulting from having to generate and process the low voltage control signal input (LV) based on operating voltage; and voltage scaling of memory write cycle time that is not seamless across the entire operating voltage range because there will be an abrupt change in write cycle performance when the operating voltage changes across the threshold point for low voltage control signal (LV) and the low voltage control signal transitions in response thereto.

More generally speaking, the prior art solutions consider two options.

In a first option, the designer may decide the capacitance on the internal complement node REFIC and the logic delay subsequent to asserting a change of state in the timer cells 42 based on the required "wordline pulse width" for a statistically worst memory cell 10 with respect to write time, at the minimum required memory functional operating voltage, and live with the same setting on other voltages within the desired range of operating voltages.

In a second option, the designer may decide the parameters as in the first option at multiple voltage points for change in state of the internal nodes across the required memory functional voltage range, and then tune those parameters to achieve a required "wordline pulse width" at the lowest voltage point of each decided voltage range and control the selection of a respective setting with control pins (LV) required to be asserted/deasserted corresponding to the voltage range of operation at any point of time.

The reason for the difference in voltage characteristics mentioned above is that the current of a mosfet as a function of operating voltage is such that the change in current is much greater with change in voltage when the operating voltage of the memory is nearer to the transistor threshold voltage, as compared to when operating voltage of the memory is much higher than the transistor threshold voltage. Consider an operating voltage that is near the threshold voltage and the design of the write timer cells 42 so as to ensure qualification of the memory with respect to worst memory cell write time by, in accordance with the prior art techniques discussed above, slowing down operation of the write timer cells (for example, by loading the internal complement node REFIC with some capacitance) or alternatively introducing a logic delay with respect to the signal WRITERST. If the write timer cells 42 are then operated at a voltage that is much higher than the threshold voltage (nominal operation), those skilled in the art will recognize that the same write timer cells 42 would lead to a much slower write time for the timer cells at a higher voltage leading to allowing for a much higher write time requirement than necessary for the write cell with a statistically worst write time. In other words, the performance (write cycle time) will be sub-optimal at higher operating voltages. The amount of extra margin that is undesirably introduced at those higher operating voltages increases as the designed-to minimum operating voltage is lowered.

A need exists in the art to address the foregoing problems with respect to self-timed memory operation over a wide range of supply voltages. Such a memory will support optimum write cycle time in the nominal (higher) voltage range required during high frequency operations while still remaining functional for write with a lower operating voltage, without any control signal requirements from the system, even though operating frequency may be lower at the lower operating voltage.

SUMMARY

In an embodiment, a circuit comprises: a memory cell array including a first section having a plurality of memory cells and at least one data bit line for each column of memory cells in said first section and a second section having a plurality of write timer cells arranged in a column, each write timer cell including an internal true node, an internal complement node and a pullup transistor having a gate terminal coupled to said internal true node, said second section including at least one reference bit line coupled to the column of write timer cells and having a true reference internal line coupled to the internal true nodes of the column of write timer cells. The circuit further includes column circuitry coupled to the first and second sections of the memory cell array, said column circuitry including a reference write driver circuit having an output coupled to drive said at least one reference bit line; and means for lowering a gate to source voltage of the write timer cell pullup transistor by raising a lower voltage level to which said internal true node is pulled down during a write operation to a voltage level above logic low level.

In an embodiment, a memory includes a plurality of memory cells and self-timing circuitry for the memory comprises: a plurality of write timer cells arranged in a column, each write timer cell including a reference word line shared in common with said write timer cells, an internal true node, an internal complement node and a pullup transistor having a gate terminal coupled to said internal true node; a reference bit line coupled to the column of write timer cells; a complement reference internal line coupled to the internal complement nodes of the column of write timer cells; a reference write driver circuit having an output coupled to said reference bit line and configured to initiate a write operation in said write timer cells; a detecting circuit coupled to said complement reference internal line and having an output whose logic state changes in response to completion of said write operation in said write timer cells; and a circuit configured to lower a gate to source voltage of the write timer cell pullup transistors by raising to which said internal true nodes are pulled down during a write operation.

In an embodiment, a method comprises: writing a first logic value to a true side of a write timer cell of a self-timed memory, said write timer cell including a pullup transistor having a gate terminal coupled to an internal true node; detecting a completion of a second logic value write at a complement side of the write timer cell of the self-timed memory; signaling a write reset of the self-timer memory in response to detected completion; and lowering a gate to source voltage of the write timer cell pullup transistor by raising a lower logic level voltage to which said internal true node is pulled down during a write operation.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 3:
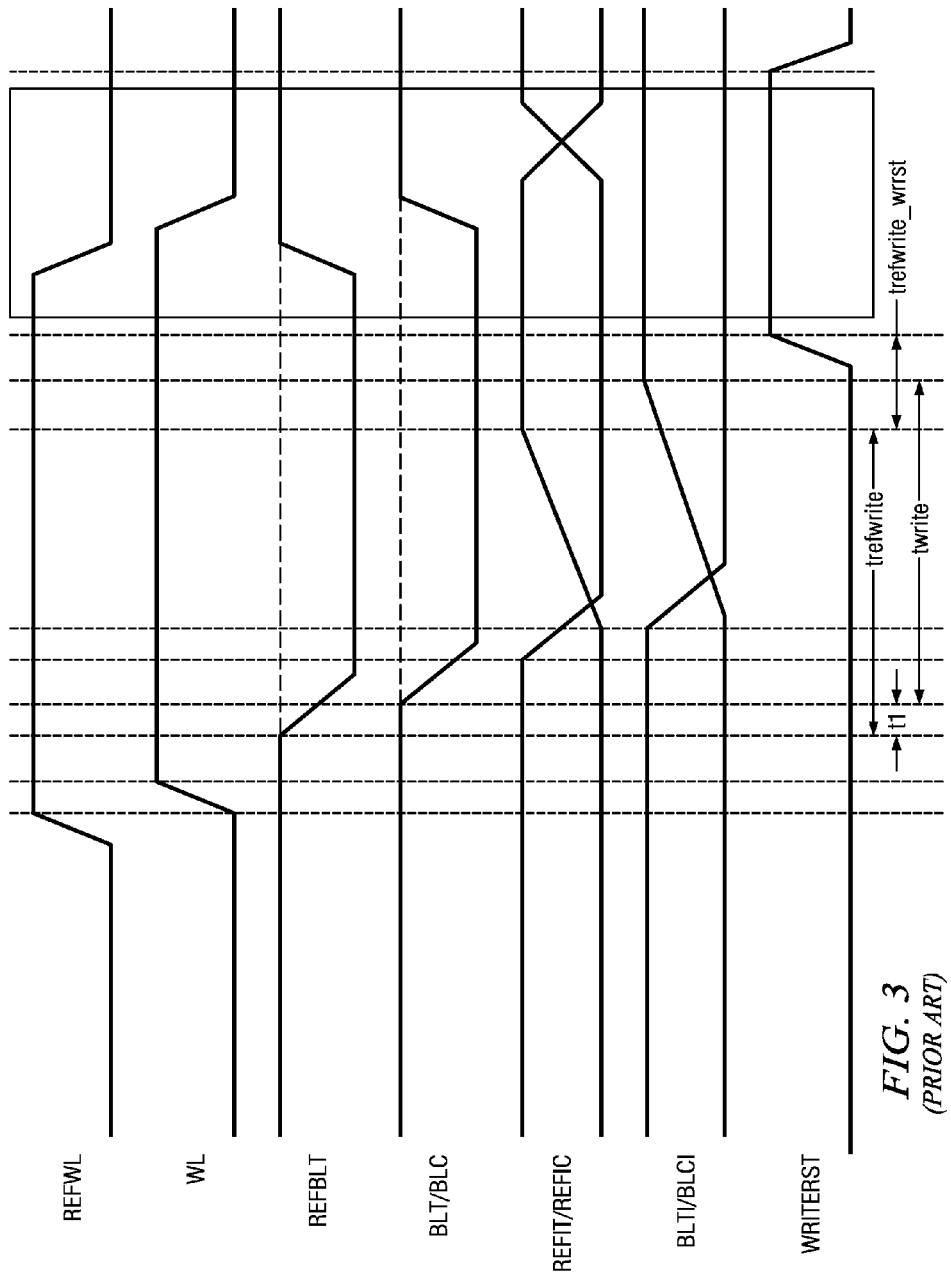
FIG. 3 shows a timing diagram concerning operation of the memory of FIG. 2.

Reference is once again made to FIG. 3. As discussed previously, the ideal operating scenario so as to have optimal performance of the memory is to have the times TREF-WRITE and TWRITE substantially the same across the operating voltage range. Again, the delay TREFWRITE represents the time needed for the internal complement node REFIC of the write timer cells 42 to change from logic low to logic high, and the delay TWRITE represents the write time of a memory cell 10 with a statistically worst write time in the first section 32. The identified problem is that TWRITE degrades much faster with voltage reduction, as compared to TREFWRITE. This is due to the higher threshold voltage "vt" of the pullup transistor in the memory cell 10 with the statistically worst write time (as compared to threshold voltage of the equivalent pullup presented by the parallel connected write timer cells 42). Improved matching of the times for TREFWRITE and TWRITE over a range of operating voltage can be accomplished if the overdrive factor (gate to source voltage "vgs" minus threshold voltage "vt"; i.e., "vgs-vt") of the pullup p-channel devices in the parallel connected write timer cells 42 is reduced by a similar amount as the expected threshold voltage "vt" increase in the p-channel pullup device of the memory cell with the statistically worst write time.

Unfortunately, it is complicated and impractical to control the threshold voltage "vt" of the transistors in the timer cells 42 through the fabrication process. In any event, the timer cells 42 nonetheless tend to provide a flip time TREFWRITE corresponding to nominal threshold voltage "vt" owing to presence of multiple timer cells. A possible way to emulate the shift in threshold voltage "vt" of the devices in the memory cell 10 with a statistically worst write time (for which the design is to be qualified) is to instead reduce the gate to source voltage "vgs" of pullup devices within the timer cells 42 by an amount that is equivalent to the amount of threshold voltage "vt" shift expected in pullup devices of the memory cell with the statistically worst write time. This will lead to a same overdrive factor "vgs-vt" upon which a transistor current is dependent on the devices in the timer cells 42 as is present on the devices in the memory cell 10 producing the statistically worst write time. Thus, this allows for maintenance of a close tracking relationship between TREF-WRITE and TWRITE over the operating voltage range.

Two options for solution of the problems noted herein are presented.

In a first option, a circuit is introduced to generate a new (intermediate) supply voltage that is higher by a "delta" amount from logic low voltage level (ground), where "delta" is the expected shift in threshold voltage "vt" in the pullup devices of the memory cell with the statistically worst write time to be qualified, and then use this new supply voltage which is higher by the "delta" amount over ground (logic low) level as the lower supply voltage on the final inverting stage of the reference bitline write driver. Additionally, the number of timer cells, capacitance on internal complement node REFIC, and other parameters are chosen to meet the required "wordline pulse width" at the lowest voltage in the full operating voltage range at a worst case temperature and for a worst case process corner.

In a second option, a circuit is introduced to restrict the pulldown voltage level of the reference bitline to a voltage level that is higher from logic low voltage level (ground) by a "delta" amount, where "delta" is the expected shift in threshold voltage "vt" of the pullup device of the memory cell with the statistically worst write time to be qualified. Additionally, the number of timer cells, capacitance on internal complement node REFIC, and other parameters are chosen to meet the required "wordline pulse width" at the lowest voltage in the full operating voltage range at a worst case temperature and for a worst case process corner.

The gate to source voltage "vgs" of the pullup devices of the timer cells 42 is decided by the voltage level to which the internal true node REFIT is driven by the reference write driver during a write cycle. So, in order to achieve a lower gate to source voltage "vgs" on the pullup devices of the timer cells 42, embodiments herein propose use of a circuit which provides a mechanism to increase the lower voltage level of the reference bitline from a logic low level "GND" to "GND+delta" with "delta" being constant and independent of the operating voltage "VDD" and decided based on an estimation of a shift in threshold voltage "vt" of the pullup device of the memory cell 10 with the statistically worst write time to be qualified. The better the control exercised over the low voltage value for the reference bitline with respect to operating voltage, process, and temperature change, the more optimal the write cycle performance of the memory during self-timed write operation across the entire operating voltage range.

Figure 1:
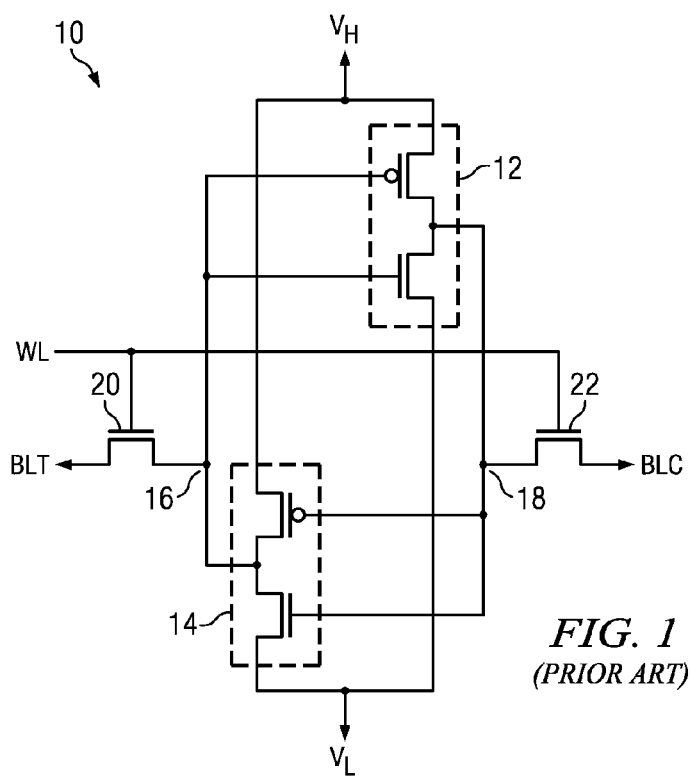
FIG. 1 is a schematic diagram of a standard six transistor static random access memory (SRAM) cell.
Figure 4:
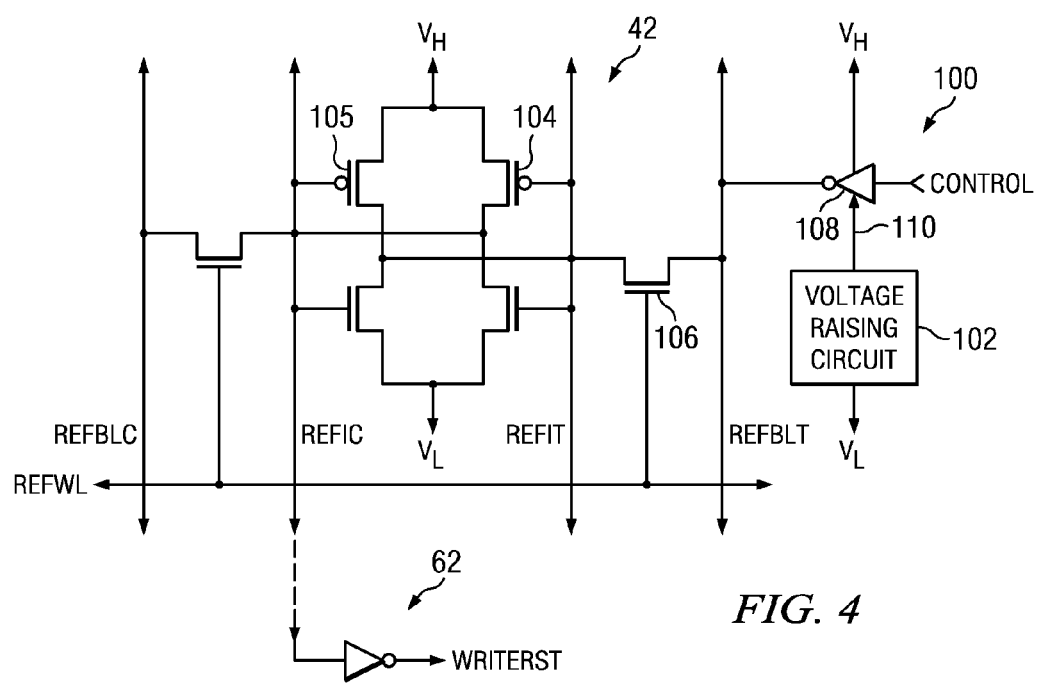
FIG. 4 illustrates a circuit diagram of a timer cell and reference true bit line driver circuit.
Figure 2:
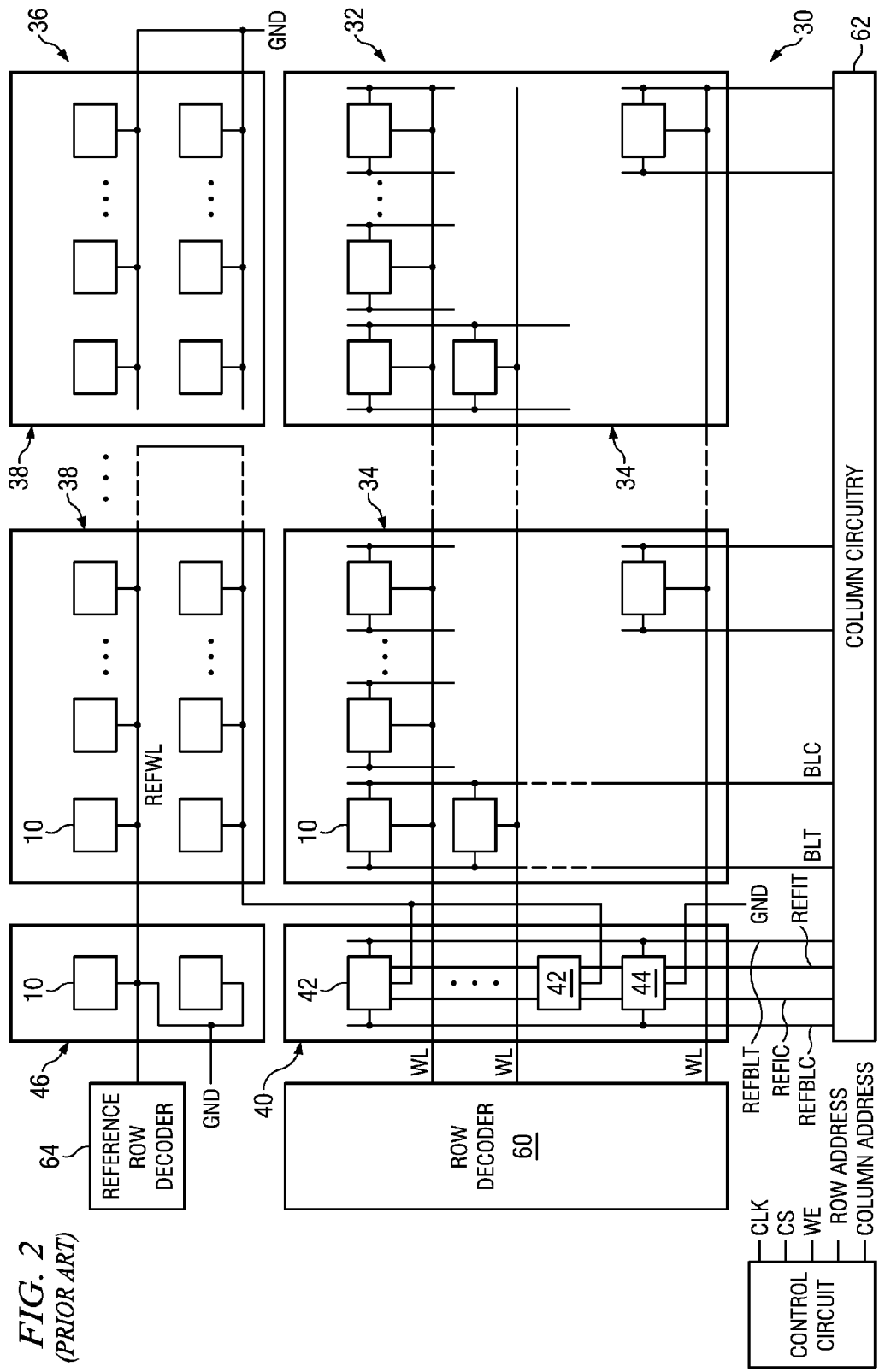
FIG. 2 shows a block diagram of a self-timed memory.

Reference is now made to FIG. 4 which illustrates a circuit diagram of a timer cell 42 and a reference true bit line driver circuit 100 which is included within the column circuitry 62 of the memory 30.

In prior art reference bitline driver circuits, a driver (perhaps comprising multiple inverting stages) would have power supply nodes connected to the positive voltage supply (VDD) and the ground voltage supply (GND). Thus, a final inverting driver of the reference bitline write driver would produce an output signal, responsive to an input internal clock signal on CONTROL, with a voltage swing from ground level (GND) to full supply voltage level (VDD). This output signal would be applied to the internal true node REFIT of each included (and parallel connected) timer cell 42 through the reference bitline REFBLT.

In FIG. 4, however, the final stage inverting driver 108 of the reference true bit line driver circuit 100 has power supply nodes that are connected to the positive voltage supply (VDD at node $V_H$) and to an intermediate voltage node 110 that is higher than the ground (logic low) voltage supply (GND at node $V_L$) by a "delta" value. To accomplish this, a voltage raising circuit 102 is introduced between the lower power supply node (intermediate node 110) of the inverting driver 108 of the reference true bit line driver circuit 100 and the ground voltage supply (GND at node $V_L$). As a result, the inverting driver 108 produces an output signal, responsive to an input clock control signal on CONTROL, with a voltage swing from the intermediate voltage "GND+delta" to "VDD". When the intermediate voltage "GND+delta" is passed by the passgate 106 to the internal true node REFIT, that intermediate voltage "GND+delta" is then present on the gate of the pullup device 104 which then lowers the gate to source voltage "vgs" of that pullup device 104. The "delta" value introduced by the voltage raising circuit 102 is selected to be an estimate of an expected "vt" shift in the devices of the memory cell with a statistically worst write time to be qualified.

It will be understood that the source connection of device 105 to the positive voltage supply (VDD at node $V_H$) may be removed if there exists a risk of write on the reference write cell, as during the write operation, the passgate device 106 has to fight with the pullup device 105 in pulling down the node REFIT to logic low level.

The voltage raising circuit 102 may comprise any of the many commonly used bias generator circuits, which are well known to those skilled in prior art. Such a bias generator circuit would receive the positive voltage supply at node $V_H$ (VDD) and the lower supply voltage at node $V_L$ (GND) and be configured to generate an intermediate voltage "GND+delta" for use as a lower supply voltage at node 110 for at least the final inverting driver 108 of the reference true bit line driver circuit 100, where "delta" is a constant value independent of "VDD".

Figure 5:
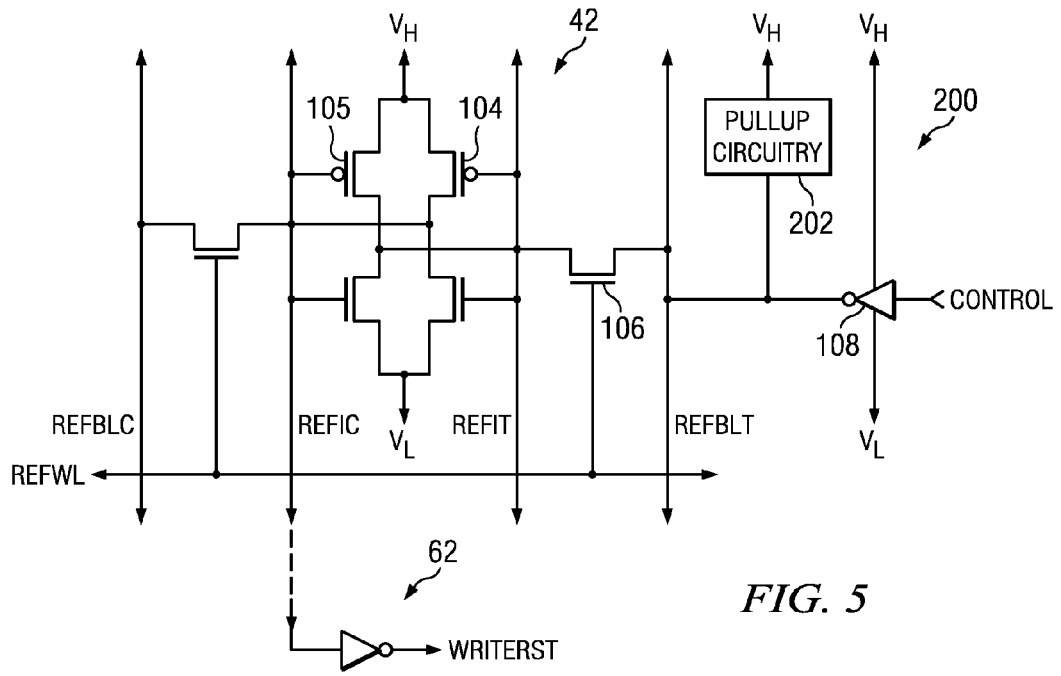
FIG. 5 illustrates a circuit diagram of a timer cell and reference true bit line driver circuit.

Reference is now made to FIG. 5 which illustrates a circuit diagram of a timer cell 42 and the reference true bit line driver circuit 200 which is included within the column circuitry 62 of the memory 30. The reference bitline driver circuit 200 comprises a driver (perhaps comprising multiple inverter stages, as illustrated) whose power supply nodes are connected to the positive voltage supply at node $V_H$ (VDD) and the ground voltage supply at node $V_L$ (GND). The final inverting driver 108 produces an output signal, responsive to an input internal clock signal on CONTROL, applied to the reference bitline REFBLT of each included (and parallel connected) timer cell 42. This signal does not, however, swing from ground level (GND) to full supply voltage level (VDD). A pullup circuit 202 is coupled to the reference bitline REFBLT between the output of the final inverting driver 108 and the positive voltage supply node "$V_H$". The pullup circuit 202 restricts the minimum voltage to which the reference true bit line REFBLT may be driven by the reference write driver to an intermediate voltage that is raised above the ground voltage supply level (GND at node $V_L$) by a "delta" value. As a result, the inverting driver 200 produces an output signal applied to the reference true bit line REFBLT, responsive to an input clock control signal on CONTROL, with a voltage swing from the intermediate voltage "ground+delta" to full supply voltage (VDD at node $V_H$). When the intermediate voltage "ground+delta" is passed by the passgate 106 to the internal true node REFIT, that intermediate voltage "ground+delta" is then present on the gate of the pullup device 104 which then lowers the gate to source voltage "vgs" of that pullup device 104. The "delta" value introduced by the pullup circuitry 202 is selected to be an estimate of an expected threshold voltage "vt" shift in the pullup device of the memory cell 10 with a statistically worst write time to be qualified.

It will be understood that the source connection of device 105 to the positive voltage supply (VDD at node $V_H$) may be removed if there exists a risk of write on the reference write cell, as during the write operation, the passgate device 106 has to fight with the pullup device 105 in pulling down the node REFIT to logic low level.

A specific example of the pullup circuit 202 is provided in FIG. 7 (to be described later). More generally, the pullup circuit 202 may comprise a circuit using suitable open/closed loop analog techniques to provide a restricted or clamped minimum voltage on the reference bitline REFBLT (of value "GND+delta") with a very good control on "delta" to maintain it constant with respect to VDD. Such circuits are well known to those skilled in the art.

Figure 7:
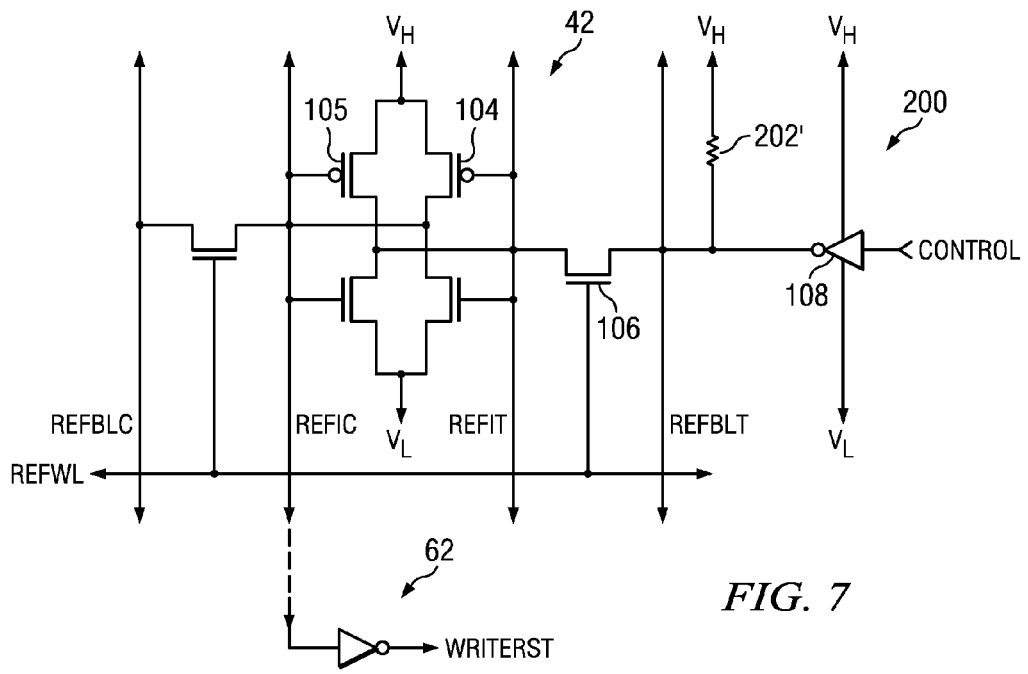
FIG. 7 illustrates a circuit diagram of a timer cell and reference true bit line driver circuit.

FIG. 7 illustrates a simple open loop exemplary pullup circuit 202 which uses resistor 202' coupled to the reference bitline REFBLT between the output of the final inverting buffer driver 108 and the positive voltage supply at node $V_H$. The resistor 202' functions to generate an intermediate voltage above the ground voltage level on the reference bitline REFBLT by restricting it from falling to full logic low level "GND" during a write cycle. As a result, the final inverting driver 108 produces an output signal, responsive to an input internal clock signal on CONTROL, with a voltage swing ranging from an intermediate voltage value that is greater than the ground voltage supply at node $V_L$ (GND) to the positive voltage supply at node $V_H$ (VDD). When this raised intermediate voltage is present on the reference bitline REFBLT for timer cell 42, that intermediate voltage gets transferred through the passgate device 106 to the internal node REFIT and lowers the gate to source voltage "vgs" of the pullup transistor 104.

The value of the resistor 202' is chosen in such a way based on the strength of the n-channel MOS transistor in the final inverting driver 108 that it counteracts the pulldown MOS transistor just enough to lead to a clamping of the lower intermediate voltage on the reference bitline REFBLT to "GND+delta", with the value of "delta" decided as near to the expected shift in threshold voltage "vt" of the pullup device of a memory cell 10 with the statistically worst write time to be qualified. The circuit of the final inverting driver 108 is not modified in any other way—the result of the addition of resistor 202' at its output node REFBLT is like a potential division resulting in some DC current during ongoing write operation but that DC current is acceptable in terms of dynamic power loss as it is present only during the write cycle duration.

Figure 6:
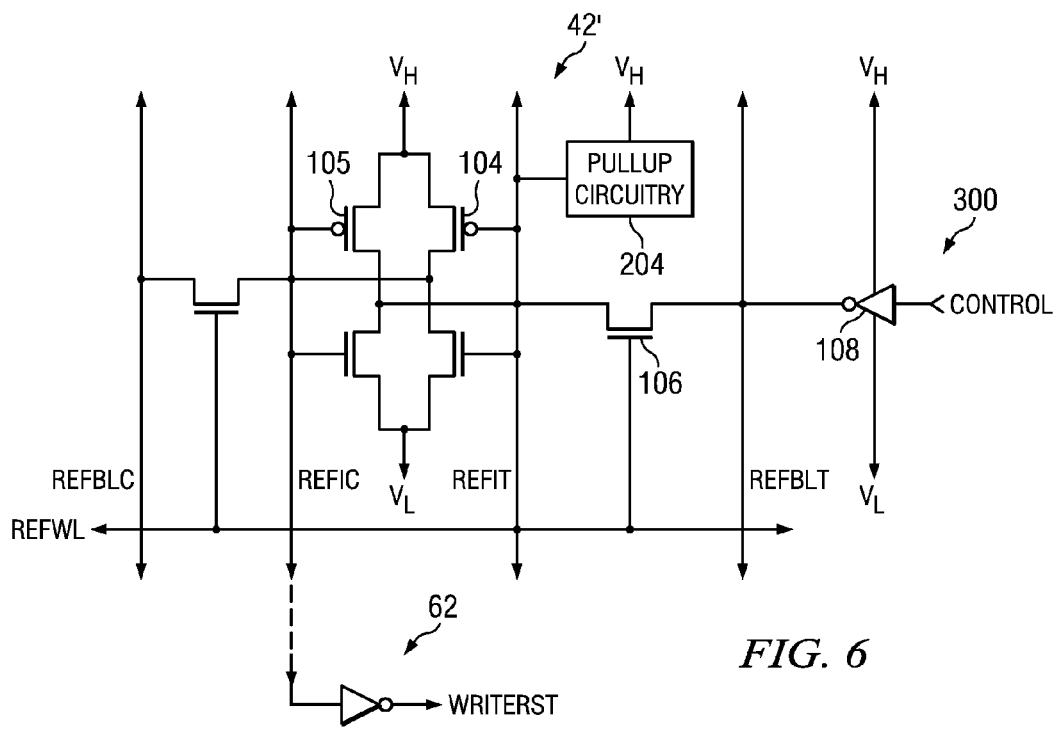
FIG. 6 illustrates a circuit diagram of a timer cell and reference true bit line driver circuit.

Reference is now made to FIG. 6 which illustrates a circuit diagram of a timer cell 42' and the reference true bit line driver circuit 300 which is included within the column circuitry 62 of the memory 30. The reference true bit line driver circuit 300 comprises a driver (perhaps comprising multiple inverter stages, as illustrated) whose power supply nodes are connected to the positive voltage supply at node $V_H$ (VDD) and the ground voltage supply at node $V_L$ (GND). The final inverting driver 108 produces an output signal, responsive to an input internal clock signal on CONTROL, applied to the reference bitline REFBLT of each included (and parallel connected) timer cell 42. This signal will swing from ground (GND) to full supply voltage (VDD) in a manner like that provided with prior art driver circuits and is applied to the reference true bit line REFBLT of each included (and parallel connected) timer cell 42'. The signal at the internal true node REFIT, however, will not swing from ground (GND) to full supply voltage (VDD). The timer cell 42' includes pullup circuitry 204 coupled to the internal true node REFIT and operable to restrict a minimum voltage on the internal true node REFIT to an intermediate voltage that is raised above the ground voltage supply (GND at node $V_L$) by a "delta" value. When the passgate 106 is actuated to pass the ground voltage at the output of the reference true bit line driver circuit 100' to the internal true node REFIT, the pullup circuitry 204 ensures to restrict the lowest voltage for the internal true node REFIT to the intermediate voltage "GND+delta". This "GND+delta" voltage is thus also on the gate of the pullup device 104 which then lowers the gate to source voltage "vgs" of that pullup device 104. The "delta" value introduced by the pullup circuitry 204 is selected to be an estimate of an expected "vt" shift in the devices of the memory cell with a statistically worst write time to be qualified.

It will be understood that the source connection of device 105 to the positive voltage supply (VDD at node $V_H$) may be removed if there exists a risk of write on the reference write cell, as during the write operation, the passgate device 106 has to fight with the pullup device 105 in pulling down the node REFIT to logic low level.

A specific example of the pullup circuit 204 is provided in FIG. 8 (to be described later). More generally, the pullup circuit 204 may comprise a circuit using suitable open/closed loop analog techniques to provide a restricted or clamped minimum voltage on the reference internal node REFIT (of value "GND+delta") with a very good control on "delta" to maintain it constant with respect to VDD. Such circuits are well known to those skilled in the art.

Figure 8:
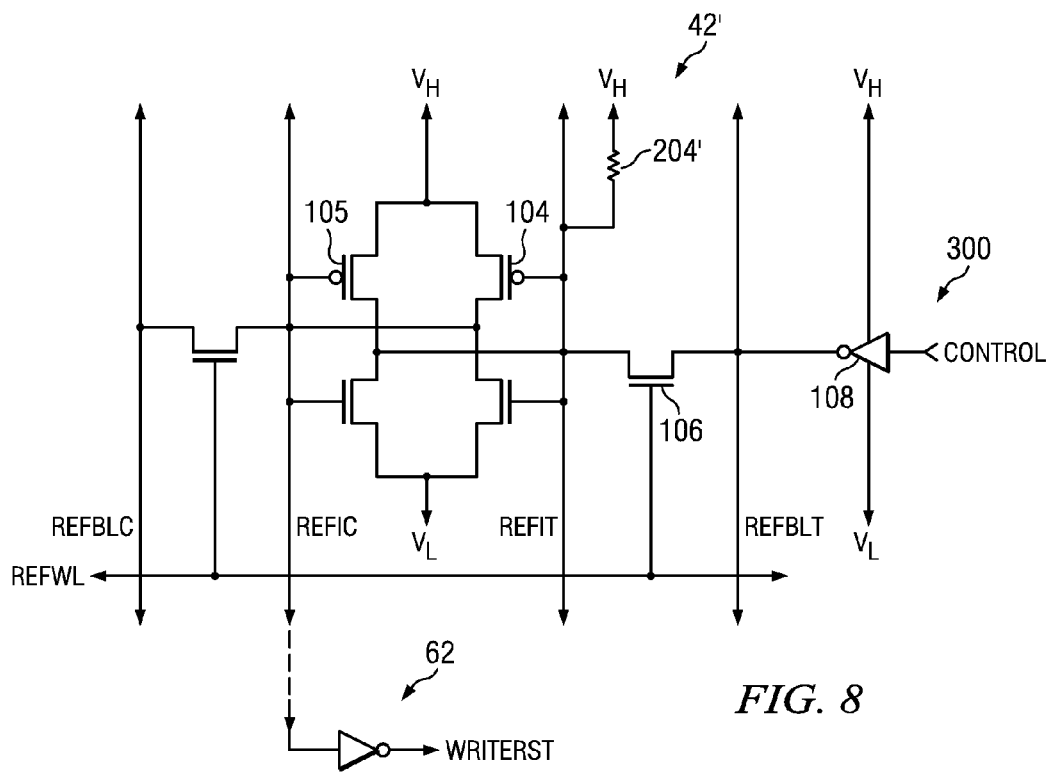
FIG. 8 illustrates a circuit diagram of timer cell and reference true bit line driver circuit.

FIG. 8 illustrates a simple open loop exemplary pullup circuit 204 which uses resistor 204' coupled to the reference internal node REFIT between the reference internal node REFIT and the positive voltage supply at node $V_H$. The resistor 204' functions to generate a voltage drop on the reference internal node REFIT by restricting it from falling to full logic low level "GND". As a result, the final inverting driver 108 produces an output signal, responsive to an input internal clock signal on CONTROL, with a voltage swing ranging from an intermediate voltage value that is greater than the ground voltage supply at node $V_L$ (GND) to the positive voltage supply at node $V_H$ (VDD). When this raised intermediate voltage is present on the reference internal node REFIT for timer cell 42, that intermediate voltage lowers the gate to source voltage "vgs" of the pullup transistor 104.

The value of the resistor 204' is chosen in such a way based on the strength of the n-channel MOS transistor in the final inverting driver 108 that it counteracts the pulldown just enough to lead to a clamping of the lower intermediate voltage on the reference internal node REFIT to "GND+delta", with the value of "delta" decided as near to the expected shift in threshold voltage "vt" of the pullup device of a memory cell 10 with a statistically worst write time to be qualified. The circuit of the final inverting driver 108 is not modified in any other way—the result of the addition of resistor 204' at reference internal node REFIT is like a potential division resulting in some DC current during ongoing write operation but that DC current is acceptable in terms of dynamic power loss as it is present only during the write cycle duration.

The reference herein to true and complement with respect to nodes or lines is a matter of labeling convenience and is not intended to be limiting or restricting as to structure or operation. Indeed, depending on logic selected for the circuit, such as active high or active low, the true and complement labels will be understood by those skilled in the art to be exchangeable.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a memory cell array including:
      a first section having a plurality of memory cells and at least one data bit line for each column of memory cells in said first section; and
      a second section having a plurality of write timer cells arranged in a column, each write timer cell including an internal true node, an internal complement node and a pullup transistor having a gate terminal coupled to said internal true node, said second section including at least one reference bit line coupled to the column of write timer cells and having a true reference internal line coupled to the internal true nodes of the column of write timer cells;
   column circuitry coupled to the first and second sections of the memory cell array, said column circuitry including a reference write driver circuit having an output coupled to drive said at least one reference bit line; and
   means for lowering a gate to source voltage of the write timer cell pullup transistor by raising a lower voltage level to which said internal true node is pulled down during a write operation to a voltage level above logic low level.

2. The circuit of claim 1, wherein a raised lower voltage level applied to said internal true node is equal to a ground reference voltage plus a delta voltage value.

3. The circuit of claim 2, wherein the delta voltage value is equal to an estimated shift in threshold voltage of a pullup transistor in a memory cell with a statistically worst write time among the plurality of memory cells in the first section of the memory cell array.

4. The circuit of claim 1, wherein raising the lower voltage level of said internal true node occurs in connection with reference write driver operation to write a low logic state to the internal true node of the write timer cell.

5. The circuit of claim 1, wherein the means for lowering comprises a voltage raising circuit coupled between a ground supply node and a lower supply node of said reference write driver circuit, said voltage raising circuit operable to apply a lower supply voltage to said lower supply node which is equal to a ground reference voltage plus a delta voltage value.

6. The circuit of claim 5, wherein the delta voltage value is equal to an estimated shift in threshold voltage of a pullup transistor in a memory cell with a statistically worst write time among the plurality of memory cells in the first section of the memory cell array.

7. The circuit of claim 1, wherein the means for lowering comprises a pullup circuit coupled to the at least one reference bit line and configured to limit a lower logic voltage applied by the write driver circuit to said at least one reference bit line to a value which is equal to a ground reference voltage plus a delta voltage value.

8. The circuit of claim 7, wherein the delta voltage value is equal to an estimated shift in threshold voltage of a pullup transistor in a memory cell with a statistically worst write time among the plurality of memory cells in the first section of the memory cell array.

9. The circuit of claim 7, wherein the pullup circuit comprises a pullup resistance coupled between the at least one reference bit line and a high supply voltage.

10. The circuit of claim 1, wherein the means for lowering comprises a pullup circuit coupled to the true reference internal line and configured to limit a lower logic voltage at said internal true node to a value which is equal to a ground reference voltage plus a delta voltage value.

11. The circuit of claim 10, wherein the delta voltage value is equal to an estimated shift in threshold voltage of a pullup transistor in a memory cell with a statistically worst write time among the plurality of memory cells in the first section of the memory cell array.

12. The circuit of claim 10, wherein the pullup circuit comprises a pullup resistance coupled between the true reference internal line and a high supply voltage.

13. The circuit of claim 1, further including a complement reference internal line coupled to the internal complement nodes of the column of write timer cells.

14. The circuit of claim 13, wherein the column circuitry further comprises a detecting circuit coupled to said complement reference internal line and having an output whose logic state changes in response to said write timer cells indicating completion of a write operation.

15. Self-timing circuitry for use in a memory, said memory including a plurality of memory cells, comprising:
   a plurality of write timer cells arranged in a column, each write timer cell including a reference word line shared in common with said write timer cells, an internal true node, an internal complement node and a pullup transistor having a gate terminal coupled to said internal true node;

a reference bit line coupled to the column of write timer cells;

a complement reference internal line coupled to the internal complement nodes of the column of write timer cells;

a reference write driver circuit having an output coupled to said reference bit line and configured to initiate a write operation in said write timer cells;

a detecting circuit coupled to said complement reference internal line and having an output whose logic state changes in response to completion of said write operation in said write timer cells; and a circuit configured to lower a gate to source voltage of the write timer cell pullup transistors by raising a lower logic level voltage to which said internal true nodes are pulled down during a write operation to a voltage level above logic low level.

16. The circuit of claim 15, wherein a raised lower logic level voltage for said internal true nodes is equal to a ground reference voltage plus a delta voltage.

17. The circuit of claim 16, wherein the delta voltage value is equal to an estimated shift in threshold voltage of a pullup transistor in a memory cell of the plurality of memory cells with a statistically worst write time.

18. The circuit of claim 16, wherein said circuit comprises a voltage raising circuit coupled between a ground reference and a lower supply node of said reference write driver circuit, said voltage raising circuit operable to apply a lower supply voltage to said lower supply node which is equal to the ground reference voltage plus the delta voltage.

19. The circuit of claim 16, wherein said circuit comprises a pullup circuit coupled between a high supply reference and the reference bit line, said pullup circuit configured to limit a lower voltage applied on said reference bit line to the ground reference voltage plus the delta voltage.

20. The circuit of claim 19, wherein the pullup circuit comprises a pullup resistance coupled between the high supply reference and the reference bit line.

21. The circuit of claim 16, further comprising a true reference internal line coupled to the internal true nodes of the column of write timer cells; and wherein said circuit comprises a pullup circuit coupled between a high supply reference and the true reference internal line, said pullup circuit configured to limit a lower voltage applied to said internal true nodes to the ground reference voltage plus the delta voltage.

22. The circuit of claim 21, wherein the pullup circuit comprises a pullup resistance coupled between the high supply reference and the true reference internal line.

23. The circuit of claim 15, wherein the raising of the lower logic level voltage for said internal true nodes occurs in connection with reference write driver operation to write a low logic state to the internal true nodes of the write timer cells.

24. A method, comprising:
writing a first logic value to a true side of a write timer cell of a self-timed memory, said write timer cell including a pullup transistor having a gate terminal coupled to an internal true node;

detecting a completion of a second logic value write at a complement side of the write timer cell of the self-timed memory;

signaling a write reset of the self-timer memory in response to detected completion; and lowering a gate to source voltage of the write timer cell pullup transistor by raising a lower logic level voltage to which said internal true node is pulled down during a write operation to a voltage level above logic low level.

25. The method of claim 24, wherein lowering adjusts a timing of completion of the writing to the write timer cell to better match a timing for completion of writing to a memory cell within the self-timed memory with a statistically worst write time.

26. The method of claim 24, wherein a raised lower logic level voltage for said internal true node is equal to a ground reference voltage plus a delta voltage.

27. The method of claim 26, wherein the delta voltage value is equal to an estimated shift in threshold voltage of a pullup transistor in a memory cell within said self-timed memory with a statistically worst write time.

28. The method of claim 24, wherein raising comprises raising a lower supply voltage for a reference write driver circuit that is operable to perform the step of writing the first logic value.

29. The method of claim 24, wherein raising comprises pulling up a lower voltage on a reference bit line to a value above ground in connection with writing a low logic state into the true side of the write timer cell.

30. The method of claim 24, wherein raising comprises pulling up a lower voltage on said internal true node to a value above ground in connection with writing a low logic state into the true side of the write timer cell.

* * * * *